United States Patent
Nishimaki et al.

(10) Patent No.: US 10,191,374 B2
(45) Date of Patent: Jan. 29, 2019

(54) RESIST UNDERLAYER FILM-FORMING COMPOSITION

(71) Applicant: NISSAN CHEMICAL INDUSTRIES, LTD., Tokyo (JP)

(72) Inventors: Hirokazu Nishimaki, Toyama (JP); Keisuke Hashimoto, Toyama (JP); Takafumi Endo, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 49 days.

(21) Appl. No.: 15/316,425

(22) PCT Filed: May 1, 2015

(86) PCT No.: PCT/JP2015/063097
§ 371 (c)(1),
(2) Date: Dec. 5, 2016

(87) PCT Pub. No.: WO2015/194273
PCT Pub. Date: Dec. 23, 2015

(65) Prior Publication Data
US 2017/0153548 A1    Jun. 1, 2017

(30) Foreign Application Priority Data
Jun. 16, 2014  (JP) ................... 2014-123225

(51) Int. Cl.
*C08G 8/02* (2006.01)
*G03F 7/11* (2006.01)
(Continued)

(52) U.S. Cl.
CPC ............... *G03F 7/11* (2013.01); *C08G 8/02* (2013.01); *C09D 161/16* (2013.01); *G03F 7/094* (2013.01);
(Continued)

(58) Field of Classification Search
CPC ..................................................... C08G 8/02
See application file for complete search history.

(56) References Cited

U.S. PATENT DOCUMENTS

| 9,416,296 B2 * | 8/2016 | Lee ........................ G03F 7/094 |
| 2012/0064725 A1 * | 3/2012 | Kinsho ................... G03F 7/091 |
|  |  | 438/703 |

FOREIGN PATENT DOCUMENTS

| JP | 2006-259249 A | 9/2006 |
| JP | 2007-199653 A | 8/2007 |
(Continued)

OTHER PUBLICATIONS

Jun. 2, 2015 Written Opinion issued in International Patent Application No. PCT/JP2015/063097.
(Continued)

*Primary Examiner* — Michael F Pepitone
(74) *Attorney, Agent, or Firm* — Oliff PLC

(57) ABSTRACT

The present invention provides a novel resist underlayer film-forming composition capable of forming a resist underlayer film that has etching resistance and excellent embeddability in a surface having concave portions and/or convex portions. A resist underlayer film-forming composition comprising a polymer having a structural unit represented by formula (1) or formula (2):

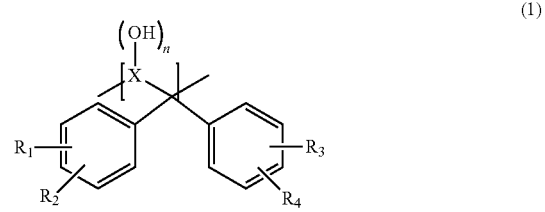

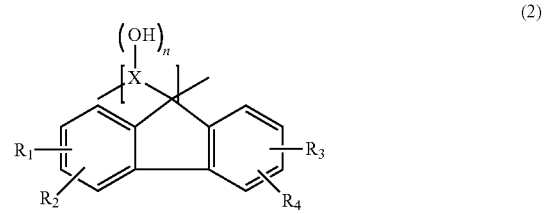

(wherein X is an arylene group, n is 1 or 2, and $R_1$, $R_2$, $R_3$, and $R_4$ are each independently a hydrogen atom, a hydroxy group, a $C_{1-3}$ alkyl group, or a phenyl group), and a solvent.

11 Claims, 2 Drawing Sheets

(51) Int. Cl.
   *C09D 161/16* (2006.01)
   *G03F 7/16* (2006.01)
   *H01L 21/308* (2006.01)
   *G03F 7/09* (2006.01)
   *H01L 21/027* (2006.01)

(52) U.S. Cl.
   CPC .............. *G03F 7/162* (2013.01); *G03F 7/168* (2013.01); *H01L 21/0271* (2013.01); *H01L 21/3081* (2013.01); *H01L 21/3086* (2013.01)

(56) References Cited

FOREIGN PATENT DOCUMENTS

| | | |
|---|---|---|
| JP | 2007-316282 A | 12/2007 |
| JP | 2009-229666 A | 10/2009 |
| JP | 2010-015112 A | 1/2010 |
| JP | 2013-253227 A | 12/2013 |
| JP | 2014-024831 A | 2/2014 |
| KR | 2013-0039864 A | 4/2013 |
| WO | 2013/047106 A1 | 4/2013 |
| WO | 2013/115097 A1 | 8/2013 |
| WO | 2014/157881 A1 | 10/2014 |

OTHER PUBLICATIONS

Jun. 2, 2015 International Search Report issued in International Patent Application No. PCT/JP2015/063097.

* cited by examiner

RESIST UNDERLAYER FILM-FORMING COMPOSITION

CROSS-REFERENCE TO RELATED APPLICATIONS

This is a National Stage Application of PCT Application No. PCT/JP2015/063097 filed on May 1, 2015, which in turn claims the benefit of Japanese Patent Application No. 2014-123225 filed on Jun. 16, 2014. The disclosure of the prior applications is hereby incorporated by reference herein in its entirety.

TECHNICAL FIELD

The present invention relates to a resist underlayer film-forming composition for a lithography process. In particular, the present invention relates to a composition for forming a resist underlayer film having embeddability in a concavo-convex surface and dry etching resistance.

BACKGROUND ART

In production of a semiconductor device, fine processing by a lithography process is carried out. In the lithography process, when a resist layer on a substrate is irradiated with an ultraviolet light laser such as a KrF excimer laser and an ArF excimer laser, there has been a problem in which a resist pattern having a desired form is not formed due to an influence of standing wave caused by reflection of the ultraviolet light laser on a surface of the substrate. In order to solve the problem, a resist underlayer film (anti-reflective coating) provided between the substrate and the resist layer is used. Use of a novolac resin as a composition for forming the resist underlayer film is known. For example, Patent Documents 1 to 3 disclose a photoresist underlayer film-forming material containing a resin having a repeating unit obtained by formation of novolac from a compound having a bisphenol group or a bisnaphthol group.

A lithography process in which at least two resist underlayer films are formed and are used as a mask material to decrease the film thickness of a resist layer required due to miniaturization of a resist pattern has been also known (see Patent Documents 1 to 5). Examples of materials for forming the at least two layers include an organic resin (e.g., acrylic resin and novolac resin), a silicon resin (e.g., organopolysiloxane), and an inorganic silicon compound (e.g., SiON and $SiO_2$). During dry etching using a pattern formed from a layer of the organic resin as a mask, the pattern needs to have dry etching resistance to an etching gas (e.g., fluorocarbon).

PRIOR ART DOCUMENTS

Patent Documents

Patent Document 1: Japanese Patent Application Publication No. 2006-259249 (JP 2006-259249 A)
Patent Document 2: Japanese Patent Application Publication No. 2007-316282 (JP 2007-316282 A)
Patent Document 3: Japanese Patent Application Publication No. 2007-199653 (JP 2007-199653 A)
Patent Document 4: Japanese Patent Application Publication No. 2009-229666 (JP 2009-229666 A)
Patent Document 5: Japanese Patent Application Publication No. 2010-015112 (JP 2010-015112 A)

SUMMARY OF THE INVENTION

Problem to be Solved by the Invention

In a conventional resist underlayer film-forming composition, although a resist underlayer film to be obtained has dry etching resistance, a concave portion is unlikely to be filled with the composition during embedding on a concavo-convex surface depending on the width, diameter, or depth of the concave portion. Therefore, voids (cavities) are likely to be formed in the concave portion, and the embeddability in the concavo-convex surface is not necessarily sufficient. For example, in Patent Document 5, evaluation of embeddability of an underlayer film-forming composition in a via is represented by "○." However, the diameter of the via is unclear, and a state that is represented by "○" is not also clear. Therefore, results of the evaluation of embeddability are not objective.

An object of the present invention is to provide an underlayer film-forming composition capable of forming a resist underlayer film that has etching resistance and excellent embeddability in a surface having concave portions and/or convex portions.

Means for Solving the Problems

The present invention is to solve the problems. Specifically, the present invention is a resist underlayer film-forming composition comprising a polymer having a structural unit of the following Formula (1) or (2):

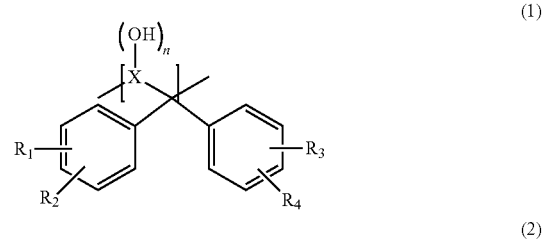

(1)

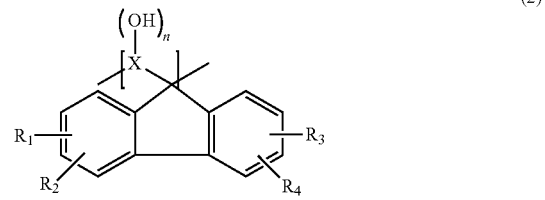

(2)

(wherein X is an arylene group, n is 1 or 2, and $R_1$, $R_2$, $R_3$, and $R_4$ are each independently a hydrogen atom, a hydroxy group, a $C_{1-3}$ alkyl group, or a phenyl group), and a solvent.

Examples of the arylene group include phenylene group and naphthylene group.

The resist underlayer film-forming composition of the present invention may further contain a crosslinker as an optional component. In addition to the crosslinker, the resist underlayer film-forming composition may contain an acidic compound of promoting a cross-linking reaction.

It is preferable that the resist underlayer film-forming composition of the present invention further contain a surfactant in terms of coating property to a base material.

Effects of the Invention

The resist underlayer film-forming composition of the present invention imparts resistance to etching using an etching gas such as fluorocarbon to a resist underlayer film to be formed from the composition and imparts excellent embeddability in a surface having concave portions and/or convex portions. Accordingly, the present invention can provide an excellent resist underlayer film having etching resistance and having no voids in concave portions of a concavo-convex surface.

MODES FOR CARRYING OUT THE INVENTION

Figure 1:
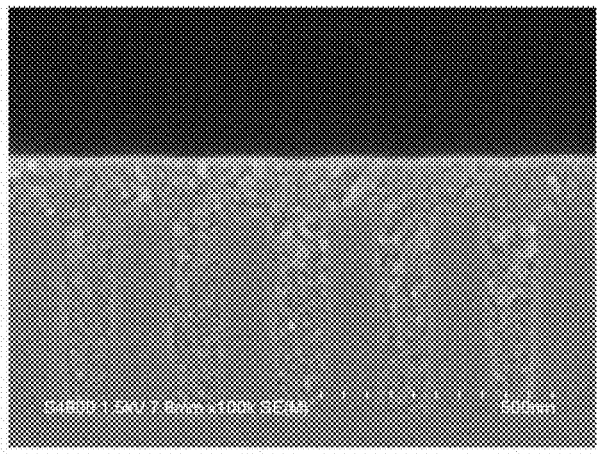
FIG. 1 is a cross-sectional SEM photograph illustrating a result of an embeddability test using a resist underlayer film-forming composition prepared in Example 1.
Figure 2:
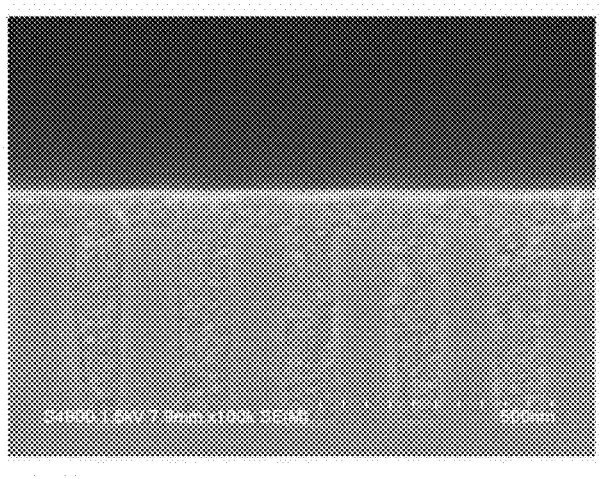
FIG. 2 is a cross-sectional SEM photograph illustrating a result of an embeddability test using a resist underlayer film-forming composition prepared in Example 2.
Figure 3:
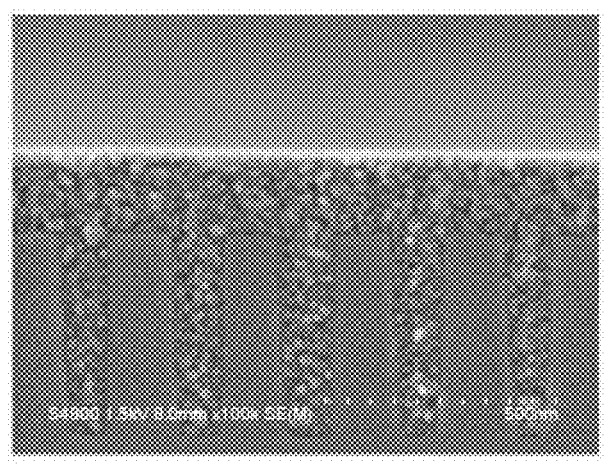
FIG. 3 is a cross-sectional SEM photograph illustrating a result of an embeddability test using a resist underlayer film-forming composition prepared in Example 3.
Figure 4:
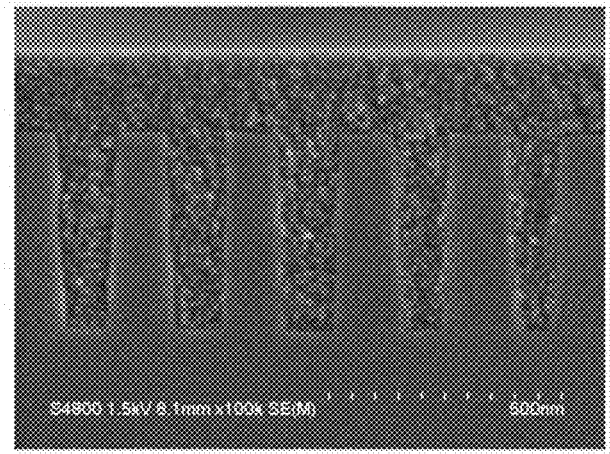
FIG. 4 is a cross-sectional SEM photograph illustrating a result of an embeddability test using a resist underlayer film-forming composition prepared in Example 4.
Figure 5:
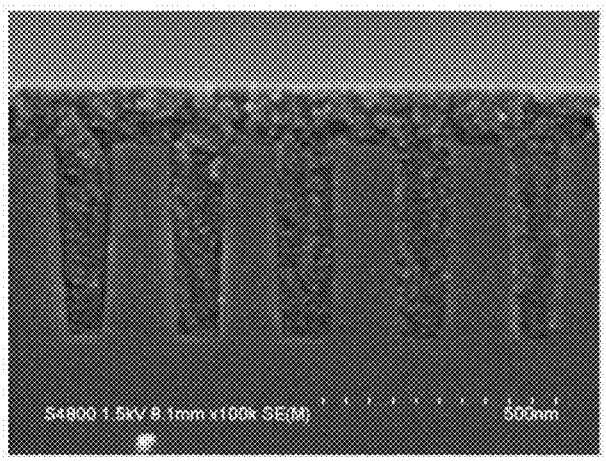
FIG. 5 is a cross-sectional SEM photograph illustrating a result of an embeddability test using a resist underlayer film-forming composition prepared in Example 5.

Examples of the structural unit of Formula (1) contained in the resist underlayer film-forming composition of the present invention include structural units of the following Formulae (1-1) to (1-20).

(1-1)

(1-2)

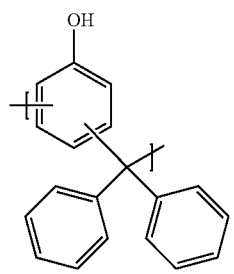

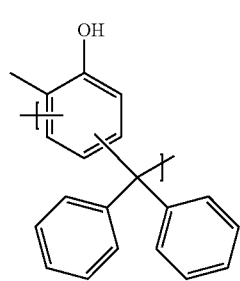

(1-3)

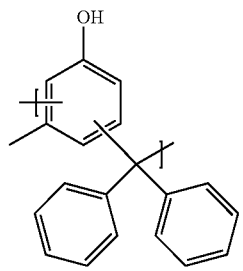

(1-4)

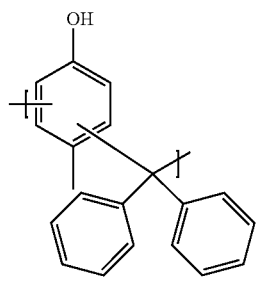

(1-5)

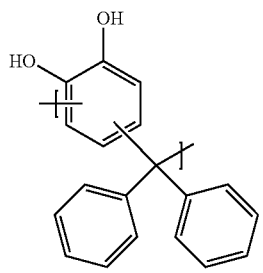

(1-6)

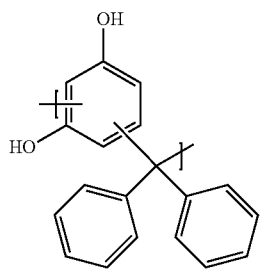

(1-7)

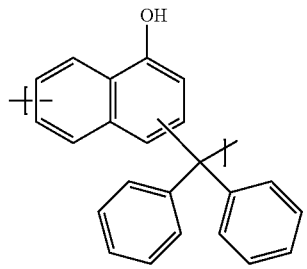

(1-8)

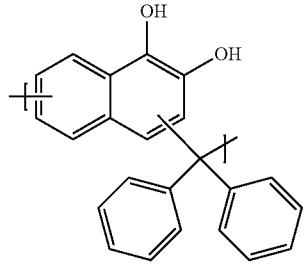

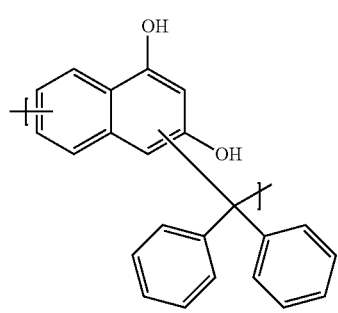
(1-9)
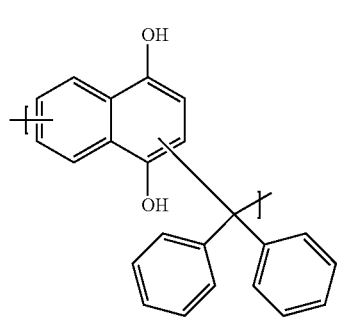
(1-10)
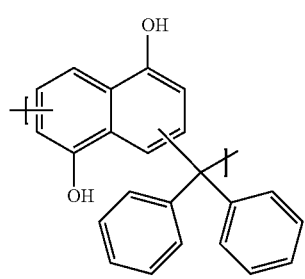
(1-11)
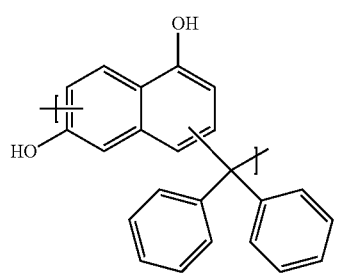
(1-12)
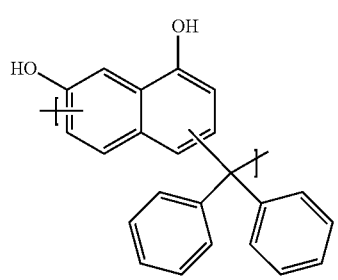
(1-13)
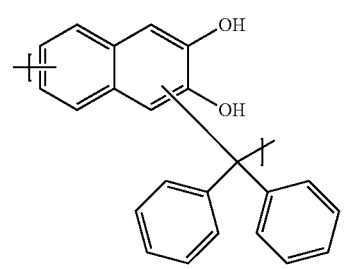
(1-14)
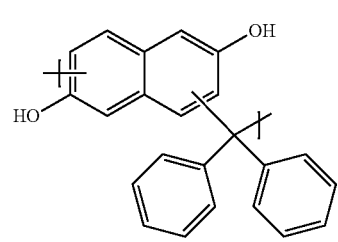
(1-15)
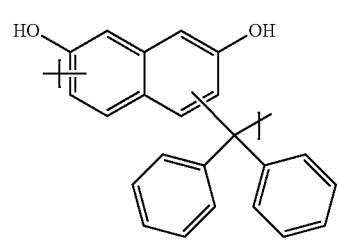
(1-16)
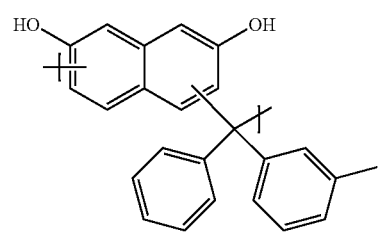
(1-17)
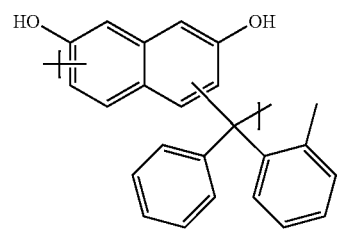
(1-18)
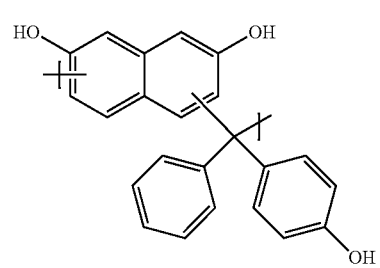
(1-19)

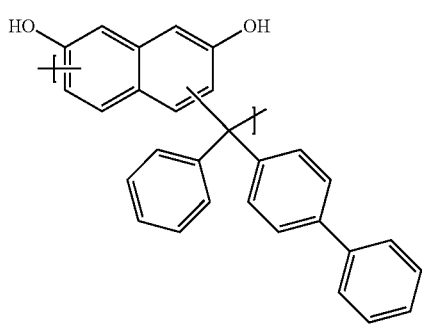
(1-20)
Examples of the structural unit of Formula (2) include structural units of the following Formulae (2-1) to (2-16).
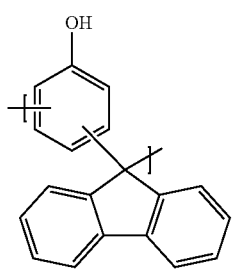
(2-1)
(2-2)
(2-3)
(2-4)
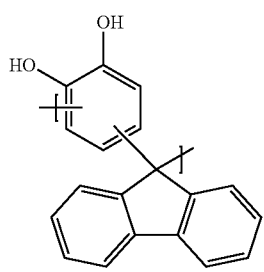
(2-5)
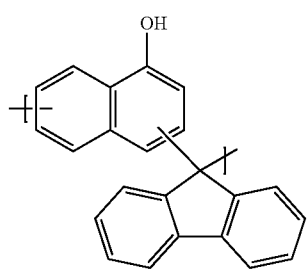
(2-6)
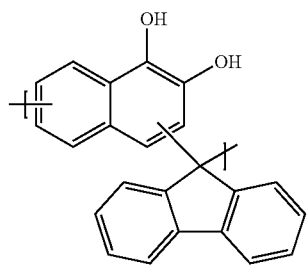
(2-7)
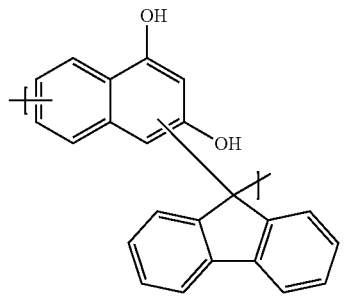
(2-8)
(2-9)

(2-10) 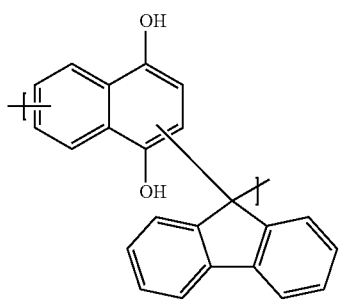

(2-11) 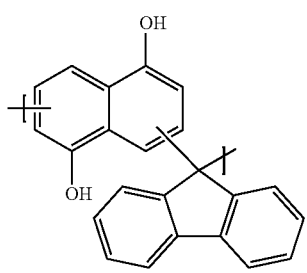

(2-12) 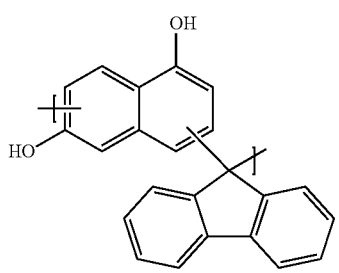

(2-13) 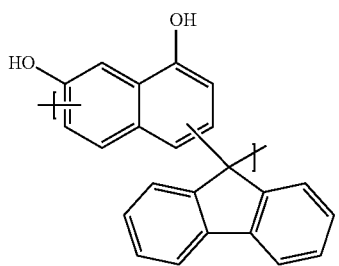

(2-14) 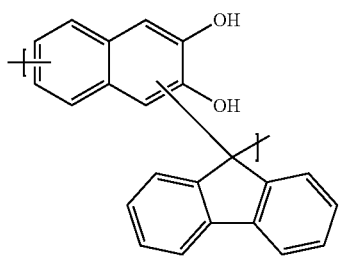

(2-15) 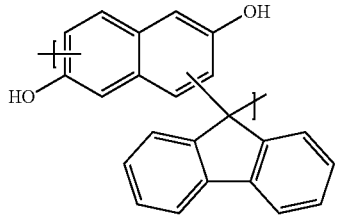

(2-16) 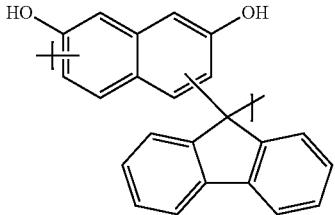

The weight average molecular weight of the polymer in the resist underlayer film-forming composition of the present invention is for example, 1,000 to 10,000 in terms of standard polystyrene.

The polymer can be synthesized by a polymerization reaction of phenol, naphthol, or a derivative thereof with benzophenone, fluorenone, or a derivative thereof in the presence of an acid catalyst such as a sulfonic acid compound in a solvent. Examples of the derivative of phenol used in the synthesis of the polymer include o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-tert-butylphenol, 3-tert-butylphenol, 4-tert-butylphenol, resorcinol, 2-methylresorcinol, 4-methylresorcinol, 5-methylresorcinol, catechol, 4-tert-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-tert-butyl-5-methylphenol, thymol, and isothymol. Examples of the derivative of naphthol include 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,6-dihydroxynaphthalene, and 2,7-dihydroxynaphthalene. Examples of the derivative of benzophenone used in the synthesis of the polymer include 3-methylbenzophenone, 2-methylbenzophenone, 4-methylbenzophenone, 2-hydroxybenzophenone, 4-hydroxybenzophenone, 4-phenylbenzophenone, 4,4'-dimethylbenzophenone, 3,4-dimethylbenzophenone, 2,4-dimethylbenzophenone, 2-hydroxy-5-methylbenzophenone, 2,2'-dihydroxybenzophenone, 2,4-dihydroxybenzophenone, 3,4-dihydroxybenzophenone, 4,4'-dihydroxybenzophenone, 2,3,4-trihydroxybenzophenone, 2,2',4,4'-tetramethylbenzophenone, 2,2',4,4'-tetrahydroxybenzophenone, 2,3',4,4'-tetrahydroxybenzophenone, and 2,3,4,4'-tetrahydroxybenzophenone. Examples of the derivative of fluorenone include 2-hydroxy-9-fluorenone. The phenol, naphthol, or derivative thereof used in the synthesis of the polymer is not restricted to one type of compound, and two or more types thereof may be used. The benzophenone, fluorenone, or derivative thereof is not restricted to one type of compound, and two or more types thereof may be used.

The resist underlayer film-forming composition of the present invention may further contain a crosslinker. As the crosslinker, a cross-linking compound having at least two crosslink-forming substituents is preferably used. Examples thereof include a melamine-based compound, a substituted urea-based compound, and a phenol-based compound that have crosslink-forming substituents such as methylol groups and methoxymethyl groups. Specific examples thereof include methoxymethylated glycoluril and methoxymethylated melamine. Further examples thereof may include tetramethoxymethyl glycoluril, tetrabutoxymethyl glycoluril, and hexamethoxymethyl melamine. In addition, examples of the substituted urea-based compound may include tetramethoxymethyl urea and tetrabutoxymethyl urea. Examples of the phenol-based compound may include tetrahydroxymethyl biphenol, tetramethoxymethyl biphenol, and tetramethoxymethyl bisphenol.

As the crosslinker, a compound having at least two epoxy groups may be used. Examples of such a compound may include tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidyl phenyl glycidyl ether, 1,1,3-tris[p-(2,3-epoxypropoxy)phenyl]propane, 1,2-cyclohexane dicarboxylic acid diglycidyl ester, 4,4'-methylene bis(N,N-diglycidyl aniline), 3,4-epoxycyclohexylmethyl-3,4-epoxycyclohexane carboxylate, trimethylol ethane triglycidyl ether, bisphenol-A-diglycidyl ether, EPOLEAD™ GT-401, GT-403, GT-301, and GT-302, and CELLOXIDE™ 2021 and 3000 available from Daicel Corporation, 1001, 1002, 1003, 1004, 1007, 1009, 1010, 828, 807, 152, 154, 180S75, 871, and 872 available from Mitsubishi Chemical Corporation, EPPN201, and 202, and EOCN-102, 103S, 104S, 1020, 1025, and 1027 available from Nippon Kayaku Co., Ltd., Denacol™ EX-252, EX-611, EX-612, EX-614, EX-622, EX-411, EX-512, EX-522, EX-421, EX-313, EX-314, and EX-321 available from Nagase ChemteX Corporation, CY175, CY177, CY179, CY182, CY184, and CY192 available from BASF Japan Ltd., and EPICLON 200, 400, 7015, 835LV, and 850CRP available from DIC Corporation. As the compound having at least two epoxy groups, an epoxy resin having an amino group may be further used. Examples of such an epoxy resin include YH-434 and YH-434L (available from NSCC Epoxy Manufacturing Co., Ltd.).

As the crosslinker, a compound having at least two blocked isocyanate groups may be used. Examples of such a compound include TAKENATE™ B-830 and B-870N available from Mitsui Chemicals, Inc., and VESTANAT™ B1358/100 available from Evonik Degussa GmbH.

As the crosslinker, a compound having at least two vinyl ether groups may be used. Examples of such a compound may include bis(4-(vinyloxymethyl)cyclohexylmethyl) glutarate, tri(ethylene glycol) divinyl ether, divinyl adipate ester, diethylene glycol divinyl ether, 1,2,4-tris(4-vinyloxybutyl) trimellitate, 1,3,5-tris(4-vinyloxybutyl) trimellitate, bis(4-(vinyloxy)butyl) terephthalate, bis(4-(vinyloxy)butyl) isophthalate, ethylene glycol divinyl ether, 1,4-butanediol divinyl ether, tetramethylene glycol divinyl ether, tetraethylene glycol divinyl ether, neopentyl glycol divinyl ether, trimethylolpropane trivinyl ether, trimethylol ethane trivinyl ether, hexanediol divinyl ether, 1,4-cyclohexanediol divinyl ether, tetraethylene glycol divinyl ether, pentaerythritol divinyl ether, pentaerythritol trivinyl ether, and cyclohexane dimethanol divinyl ether.

To the resist underlayer film-forming composition of the present invention, one selected from the crosslinkers may be added or two or more types thereof may be added in combination. The content of the crosslinker is, for example, 2% by mass to 60% by mass relative to a solid content of the resist underlayer film-forming composition of the present invention except for a solvent described below.

The resist underlayer film-forming composition of the present invention may further contain an acidic compound. The acidic compound acts as a catalyst of promoting a cross-linking reaction. Examples thereof may include sulfonic acid compounds and carboxylic acid compounds such as p-toluenesulfonic acid, trifluoromethanesulfonic acid, pyridinium p-toluenesulfonate, salicylic acid, camphorsulfonic acid, 5-sulfosalicylic acid, 4-chlorobenzenesulfonic acid, 4-hydroxybenzenesulfonic acid, benzenedisulfonic acid, 1-naphthalenesulfonic acid, citric acid, benzoic acid, and hydroxybenzoic acid, an inorganic acid such as hydrochloric acid, sulfuric acid, nitric acid, and phosphoric acid. Instead of or with the acidic compound, the resist underlayer film-forming composition may contain a thermal acid generator. The thermal acid generator also acts as a catalyst of promoting a cross-linking reaction. Examples thereof may include quaternary ammonium salts of trifluoromethanesulfonic acid. To the resist underlayer film-forming composition of the present invention, one selected from the acidic compounds and the thermal acid generators may be added, or two or more types thereof may be added in combination. The content of the acidic compound or the thermal acid generator is, for example, 0.1% by mass to 20% by mass relative to the solid content of the resist underlayer film-forming composition of the present invention except for the solvent described below.

The resist underlayer film-forming composition of the present invention may further contain a surfactant. Examples of the surfactant may include nonionic surfactants including polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenyl ether and polyoxyethylene nonylphenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and fluorosurfactants including Eftop™ EF301, EF303, and EF352 (available from Mitsubishi Materials Electronic Chemicals Co., Ltd.), MEGAFACE™ F171, F173, R-30, R-40, and R-40-LM (available from DIC Corporation), Fluorad FC430 and FC431 (available from Sumitomo 3M, Ltd.), and Asahi Guard™ AG710, and Surflon™ S-382, SC101, SC102, SC103, SC104, SC105, and SC106 (available from Asahi Glass Co., Ltd.), and organosiloxane polymer KP341 (available from Shin-Etsu Chemical Co., Ltd.). To the resist underlayer film-forming composition of the present invention, one selected from the surfactants may be added, or two or more types thereof may be added in combination. The content of the surfactant is, for example, 0.01% by mass to 5% by mass relative to the solid content of the resist underlayer film-forming composition of the present invention except for the solvent described below.

The resist underlayer film-forming composition of the present invention can be prepared by dissolving the respective components in an appropriate solvent. The resist underlayer film-forming composition can be used in a homogeneous solution state. Examples of such a solvent include ethylene glycol monomethyl ether, ethylene glycol monoethyl ether, diethylene glycol monomethyl ether, diethylene glycol monoethyl ether, propylene glycol, propylene glycol monomethyl ether, propylene glycol monopropyl ether, propylene glycol monomethyl ether acetate, propylene glycol propyl ether acetate, methyl cellosolve acetate, ethyl cellosolve acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethyl formamide, N,N-dimethyl acetamide, and N-methylpyrrolidone. One type of the organic solvents may be used, or two or more types thereof may be used in combination. The ratio of the solid content of the resist underlayer film-forming composition of the present invention except for the organic solvent is, for example, 0.5% by mass to 30% by mass, and preferably 0.8% by mass to 15% by mass.

The resist underlayer film-forming composition of the present invention is applied to a surface having steps, concave portions and/or convex portions, and baked to form a first resist underlayer film, and an organopolysiloxane film is formed as a second resist underlayer film on the first resist underlayer film. On the second resist underlayer film, a resist pattern can be formed.

A step of applying the resist underlayer film-forming composition of the present invention followed by baking is carried out by applying the composition to a substrate (e.g., a silicon wafer, which may be coated with a silicon oxide film, a silicon nitride film, a silicon nitride oxide film, or a film of metal of aluminum, tungsten, or the like) by an appropriate coating method such as a spinner and a coater, followed by baking by a heating means such as a hot plate. A baking condition is appropriately selected from a baking temperature of 100° C. to 400° C. and a baking time of 0.3 minutes to 10 minutes.

In a step of forming the organopolysiloxane film as the second resist underlayer film on the first resist underlayer film formed at the aforementioned step, this second resist underlayer film may be a SiON film or a SiN film that is formed by a vapor deposition method such as CVD and PVD. On the second resist underlayer film, an anti-reflective coating (BARC) may be formed as a third resist underlayer film. The third resist underlayer film may be a film having no anti-reflective performance.

A step of forming a resist pattern on the second resist underlayer film is carried out by applying a resist solution to the second resist underlayer film or the third resist underlayer film by an appropriate coating method such as a spinner and a coater, pre-baking the resist solution under a predetermined condition, and exposing the obtained resist film. The resist solution may be a positive or negative resist. The exposure is carried out through a mask (reticle) for forming a predetermined pattern or by direct drawing. For example, a g-line, an i-line, a KrF excimer laser, an ArF excimer laser, EUV, or an electron beam can be used as an exposure light source. After the exposure, post exposure bake is carried out, if necessary. After then, development is carried out using a developer (e.g., 2.38% by mass tetramethylammonium hydroxide aqueous solution), and the used developer is removed by rinsing with a rinse liquid or pure water. Subsequently, the resist pattern is dried, and post-baked to enhance adhesion to a base.

After the resist pattern forming, when the formed resist pattern is further subjected to an etching step by dry etching, examples of an etching gas used in the dry etching for the second resist underlayer film (organopolysiloxane film) include $CHF_3$, $CF_4$, and $C_2F_6$, examples thereof for the first resist underlayer film formed from the resist underlayer film-forming composition of the present invention include $O_2$, $N_2O$, $NO_2$, and examples thereof for the surface having steps or concave portions and/or convex portions include $CHF_3$, $CF_4$, and $C_2F_6$. In the gases, argon, nitrogen, or carbon dioxide may be mixed and used.

Hereinafter, the present invention will be described with reference to Synthesis Examples and Examples, but the present invention is not especially limited to the following description.

EXAMPLES

Weight average molecular weights and polydispersity shown in the following Synthesis Examples 1 to 5 and Comparative Synthesis Example 1 are based on results measured by gel permeation chromatography (hereinafter abbreviated as GPC in the specification). In the measurement, a GPC system manufactured by TOSOH CORPORATION was used. Measurement conditions are as follows.

GPC Column: TSKgel Super Multipore™ Hz-N (TOSOH CORPORATION)
Column temperature: 40° C.
Solvent: tetrahydrofuran (THF)
Flow rate: 0.35 mL/min
Standard sample: polystyrene (TOSOH CORPORATION)

Synthesis Example 1

In a 100-mL three-neck flask, 2,7-dihydroxynaphthalene (8.00 g, 0.0499 mol, available from Tokyo Chemical Industry Co., Ltd.), 9-fluorenone (9.00 g, 0.0499 mol, available from Tokyo Chemical Industry Co., Ltd.), p-toluene sulfonic acid monohydrate (2.5803 g, 0.0150 mol, available from Tokyo Chemical Industry Co., Ltd.), and 3-mercaptopropionic acid (0.4776 g, 0.0045 mol, available from Tokyo Chemical Industry Co., Ltd.) as a promoter were placed under nitrogen, and propylene glycol monomethyl ether (19.58 g, available from KANTO CHEMICAL CO., INC.) was further placed. The mixture was stirred and heated to 120° C. to dissolve each component, resulting in polymerization. After 96 hours, the obtained polymer liquid was allowed to stand to cool to room temperature, and added to methanol (500 g, available from KANTO CHEMICAL CO., INC.), resulting in reprecipitation. The obtained precipitate was collected by filtration, dried at 50° C. for 10 hours by a reduced-pressure dryer, to obtain 16.32 g of target polymer having a structural unit of the following Formula (2-16) (hereinafter abbreviated as 2,7-DHN-FI). The weight average molecular weight Mw measured by GPC in terms of polystyrene of 2,7-DHN-FI was 1,400, and the polydispersity Mw/Mn was 1.95.

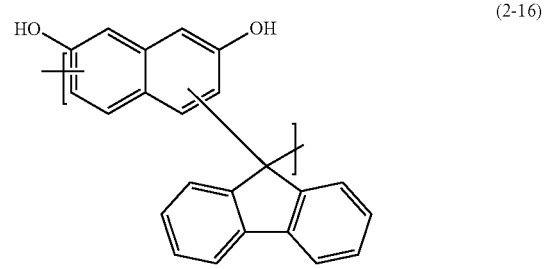

(2-16)

Synthesis Example 2

In a 100-mL three-neck flask, 2,7-dihydroxynaphthalene (8.00 g, 0.0499 mol, available from Tokyo Chemical Industry Co., Ltd.), benzophenone (9.10 g, 0.0499 mol, available from Tokyo Chemical Industry Co., Ltd.), p-toluene sulfonic acid monohydrate (2.5803 g, 0.0150 mol, available from Tokyo Chemical Industry Co., Ltd.), and 3-mercaptopropionic acid (0.4776 g, 0.0045 mol, available from Tokyo Chemical Industry Co., Ltd.) as a promoter were placed under nitrogen, and propylene glycol monomethyl ether (19.68 g, available from KANTO CHEMICAL CO., INC.) was further placed. The mixture was stirred and heated to 120° C. to dissolve each component, resulting in polymerization. After 96 hours, the obtained polymer liquid was allowed to stand to cool to room temperature, and added to methanol (500 g, available from KANTO CHEMICAL CO., INC.), resulting in reprecipitation. The obtained precipitate was collected by filtration, dried at 50° C. for 10 hours by a reduced-pressure dryer, to obtain 11.97 g of target polymer having a structural unit of the following Formula (1-16) (hereinafter abbreviated as 2,7-DHN-BzPn). The weight average molecular weight Mw measured by GPC in terms of polystyrene of 2,7-DHN-BzPn was 1,800, and the polydispersity Mw/Mn was 1.89.

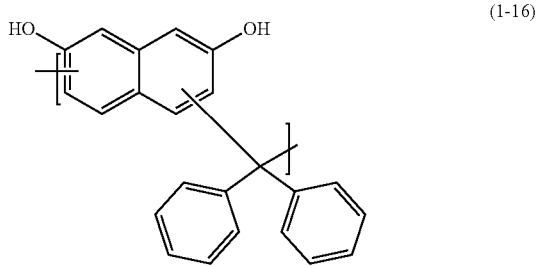

Synthesis Example 3

In a 100-mL three-neck flask, 2,7-dihydroxynaphthalene (6.50 g, 0.0406 mol, available from Tokyo Chemical Industry Co., Ltd.), 4-hydroxybenzophenone (8.04 g, 0.0406 mol, available from Tokyo Chemical Industry Co., Ltd.), methanesulfonic acid (1.1701 g, 0.0122 mol, available from Tokyo Chemical Industry Co., Ltd.), and 3-mercaptopropionic acid (0.3927 g, 0.0037 mol, available from Tokyo Chemical Industry Co., Ltd.) as a promoter were placed under nitrogen, and propylene glycol monomethyl ether (15.71 g, available from KANTO CHEMICAL CO., INC.) was further placed. The mixture was stirred and heated to 120° C. to dissolve each component, resulting in polymerization. After 96 hours, the obtained polymer liquid was allowed to stand to cool to room temperature, and added to methanol (500 g, available from KANTO CHEMICAL CO., INC.), resulting in reprecipitation. The obtained precipitate was collected by filtration, dried at 50° C. for 10 hours by a reduced-pressure dryer, to obtain 5.82 g of target polymer having a structural unit of the following Formula (1-19) (hereinafter abbreviated as 2,7-DHN-4-HBzPn). The weight average molecular weight Mw measured by GPC in terms of polystyrene of 2,7-DHN-4-HBzPn was 2,900, and the polydispersity Mw/Mn was 1.87.

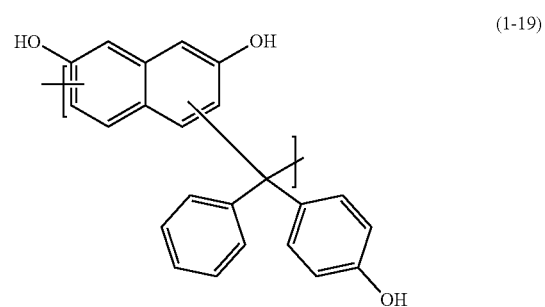

Synthesis Example 4

In a 100-mL three-neck flask, 2,7-dihydroxynaphthalene (6.50 g, 0.0406 mol, available from Tokyo Chemical Industry Co., Ltd.), 3-methylbenzophenone (7.96 g, 0.0406 mol, available from Tokyo Chemical Industry Co., Ltd.), methanesulfonic acid (1.1701 g, 0.0122 mol, available from Tokyo Chemical Industry Co., Ltd.), and 3-mercaptopropionic acid (0.3927 g, 0.0037 mol, available from Tokyo Chemical Industry Co., Ltd.) as a promoter were placed under nitrogen, and propylene glycol monomethyl ether (15.71 g, available from KANTO CHEMICAL CO., INC.) was further placed. The mixture was stirred and heated to 120° C. to dissolve each component, resulting in polymerization. After 96 hours, the obtained polymer liquid was allowed to stand to cool to room temperature, and added to methanol (500 g, available from KANTO CHEMICAL CO., INC.), resulting in reprecipitation. The obtained precipitate was collected by filtration, dried at 50° C. for 10 hours by a reduced-pressure dryer, to obtain 7.23 g of target polymer having a structural unit of the following Formula (1-17) (hereinafter abbreviated as 2,7-DHN-4-MBzPn). The weight average molecular weight Mw measured by GPC in terms of polystyrene of 2,7-DHN-4-MBzPn was 4,600 and the polydispersity Mw/Mn was 2.40.

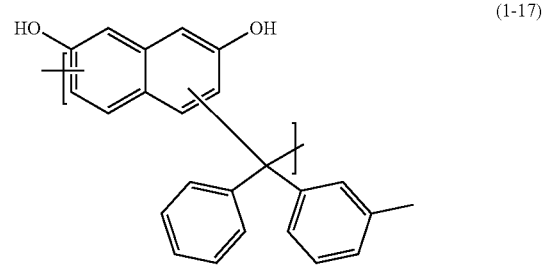

Synthesis Example 5

In a 100-mL three-neck flask, 2,7-dihydroxynaphthalene (6.50 g, 0.0406 mol, available from Tokyo Chemical Industry Co., Ltd.), 2-methylbenzophenone (7.96 g, 0.0406 mol, available from Tokyo Chemical Industry Co., Ltd.), methanesulfonic acid (1.1701 g, 0.0122 mol, available from Tokyo Chemical Industry Co., Ltd.), and 3-mercaptopropionic acid (0.3927 g, 0.0037 mol, available from Tokyo Chemical Industry Co., Ltd.) as a promoter were placed under nitrogen, and propylene glycol monomethyl ether (15.71 g, available from KANTO CHEMICAL CO., INC.)

was further placed. The mixture was stirred and heated to 120° C. to dissolve each component, resulting in polymerization. After 96 hours, the obtained polymer liquid was allowed to stand to cool to room temperature, and added to methanol (500 g, available from KANTO CHEMICAL CO., INC.), resulting in reprecipitation. The obtained precipitate was collected by filtration, dried at 50° C. for 10 hours by a reduced-pressure dryer, to obtain 4.34 g of target polymer having a structural unit of the following Formula (1-18) (hereinafter abbreviated as 2,7-DHN-2-MBzPn). The weight average molecular weight Mw measured by GPC in terms of polystyrene of 2,7-DHN-2-MBzPn was 2,200 and the polydispersity Mw/Mn was 1.68.

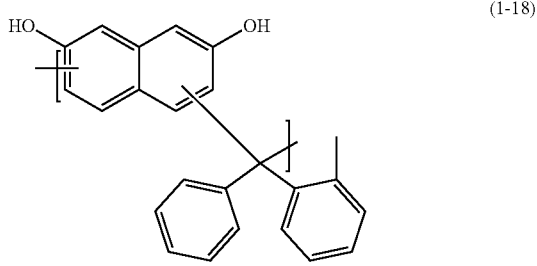

(1-18)

Comparative Synthesis Example 1

5.51 g of phloroglucinol (available from Tokyo Chemical Industry Co., Ltd.), 4.27 g of benzaldehyde (available from Tokyo Chemical Industry Co., Ltd.), 10.09 g of 1,4-dioxane (available from KANTO CHEMICAL CO., INC.), and 0.76 g of p-toluenesulfonic acid monohydrate (available from Tokyo Chemical Industry Co., Ltd.) were placed in a 100-mL eggplant-type flask. The mixture was then heated to 110° C., and stirred under reflux for about 2 hours. After completion of the reaction, the reactant was diluted with 7.54 g of tetrahydrofuran (available from KANTO CHEMICAL CO., INC.), and a precipitate was removed by filtration. The collected filtrate was added dropwise to a methanol/water mixed solution, resulting in reprecipitation. The obtained precipitate was collected by aspiration, and the filtered product was dried at 85° C. overnight under reduced pressure, to obtain 7.25 g of phloroglucinol resin having a structural unit of the following Formula in a brown powder form. The weight average molecular weight Mw measured by GPC in terms of polystyrene was 3,600, and the polydispersity index Mw/Mn was 1.34.

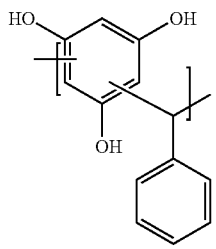

Example 1

In 1 g of the polymer obtained in Synthesis Example 1, 0.003 g of MEGAFACE R-30 (available from DIC Corporation) as a surfactant was mixed. The mixture was dissolved in 4 g of propylene glycol monomethyl ether acetate to obtain a solution. The solution was filtered through a microfilter made of polyethylene with a pore diameter of 0.10 μm, and then through a microfilter made of polyethylene with a pore diameter of 0.05 μm to prepare a resist underlayer film-forming composition used in a lithography process.

Example 2

In 1 g of the polymer obtained in Synthesis Example 2, 0.003 g of MEGAFACE R-30 (available from DIC Corporation) as a surfactant was mixed. The mixture was dissolved in 4 g of propylene glycol monomethyl ether acetate to obtain a solution. The solution was filtered through a microfilter made of polyethylene with a pore diameter of 0.10 μm, and then through a microfilter made of polyethylene with a pore diameter of 0.05 μm to prepare a resist underlayer film-forming composition used in a lithography process.

Example 3

In 1 g of the polymer obtained in Synthesis Example 3, 0.003 g of MEGAFACE R-30 (available from DIC Corporation) as a surfactant was mixed. The mixture was dissolved in 4 g of propylene glycol monomethyl ether acetate to obtain a solution. The solution was filtered through a microfilter made of polyethylene with a pore diameter of 0.10 and then through a microfilter made of polyethylene with a pore diameter of 0.05 μm to prepare a resist underlayer film-forming composition used in a lithography process.

Example 4

In 1 g of the polymer obtained in Synthesis Example 4, 0.003 g of MEGAFACE R-30 (available from DIC Corporation) as a surfactant was mixed. The mixture was dissolved in 4 g of propylene glycol monomethyl ether acetate to obtain a solution. The solution was filtered through a microfilter made of polyethylene with a pore diameter of 0.10 μm, and then through a microfilter made of polyethylene with a pore diameter of 0.05 μm to prepare a resist underlayer film-forming composition used in a lithography process.

Example 5

In 1 g of the polymer obtained in Synthesis Example 5, 0.003 g of MEGAFACE R-30 (available from DIC Corporation) as a surfactant was mixed. The mixture was dissolved in 4 g of propylene glycol monomethyl ether acetate to obtain a solution. The solution was filtered through a microfilter made of polyethylene with a pore diameter of 0.10 μm, and then through a microfilter made of polyethylene with a pore diameter of 0.05 μm to prepare a resist underlayer film-forming composition used in a lithography process.

Comparative Example 1

In 1 g of the polymer obtained in Comparative Synthesis Example 1, 0.003 g of MEGAFACE R-30 (available from DIC Corporation) as a surfactant was mixed. The mixture was dissolved in 4 g of propylene glycol monomethyl ether acetate to obtain a solution. The solution was filtered through a microfilter made of polyethylene with a pore diameter of 0.10 μm, and then through a microfilter made of polyethylene with a pore diameter of 0.05 μm to prepare a resist underlayer film-forming composition used in a lithography process.

Comparative Example 2

In 1 g of commercially available cresol novolac resin (novolac resin obtained from cresol and formaldehyde), 0.003 g of MEGAFACE R-30 (available from DIC Corporation) as a surfactant was mixed. The mixture was dissolved in 4 g of propylene glycol monomethyl ether acetate to obtain a solution. The solution was filtered through a microfilter made of polyethylene with a pore diameter of 0.10 μm, and then through a microfilter made of polyethylene with a pore diameter of 0.05 μm to prepare a resist underlayer film-forming composition used in a lithography process. The weight average molecular weight Mw measured by GPC in terms of polystyrene of the cresol novolac resin used in this Comparative Example was 4,000 and the polydispersity Mw/Mn was 2.1.

(Elution Test into Photoresist Solvent)

The resist underlayer film-forming composition prepared in each of Examples 1 to 5 and Comparative Examples 1 and 2 was applied to a silicon wafer using a spin coater, and baked on a hot plate at 350° C. for 1 minute to form a resist underlayer film (thickness: 0.25 μm). The resist underlayer film was immersed in a solvent used for a resist (ethyl lactate, propylene glycol monomethyl ether, propylene glycol monomethyl ether acetate, and cyclohexanone). It was confirmed that the resist underlayer film was insoluble in each solvent.

(Measurement of Dry Etching Rate)

An etcher and an etching gas used in measurement of dry etching rate are as follows.

Etcher: RIE-10NR (available from SAMCO INC.)
Etching gas: $CF_4$

The resist underlayer film-forming composition prepared in each of Examples 1 to 5 and Comparative Examples 1 and 2 was applied to a silicon wafer using a spin coater. The composition was baked on a hot plate at 350° C. for 1 minute to form a resist underlayer film (thickness: 0.25 The dry etching rate of each of the resist underlayer films was measured using $CF_4$ gas as an etching gas. A solution of phenol novolac resin (article on the market, weight average molecular weight Mw measured by GPC in terms of polystyrene: 2,000, polydispersity Mw/Mn: 2.5) was applied to a silicon wafer using a spin coater, and baked on a hot plate at 205° C. for 1 minute to form a phenol novolac resin film (thickness: 0.25 μm). The dry etching rate of the phenol novolac resin film was measured using $CF_4$ gas as an etching gas. Table 1 shows results obtained by calculating the dry etching rate of the resist underlayer film formed from the resist underlayer film-forming composition prepared in each of Examples 1 to 5 and Comparative Examples 1 and 2 as a dry etching rate ratio when the dry etching rate of this phenol novolac resin film is taken as 1.00. A lower dry etching rate ratio shows higher resistance to etching using a $CF_4$ gas.

Dry etching rate ratio=(dry etching rate of resist underlayer film)/(dry etching rate of phenol novolac resin film)

TABLE 1

| Dry etching rate ratio Resist underlayer film (baking temperature: 350° C.) | |
|---|---|
| Example 1 | 0.91 |
| Example 2 | 0.92 |
| Example 3 | 0.94 |
| Example 4 | 0.89 |

TABLE 1-continued

| Dry etching rate ratio Resist underlayer film (baking temperature: 350° C.) | |
|---|---|
| Example 5 | 0.90 |
| Comparative Example 1 | 1.04 |
| Comparative Example 2 | 1.00 |

(Embeddability Test into Hole Wafer)

Figure 6:
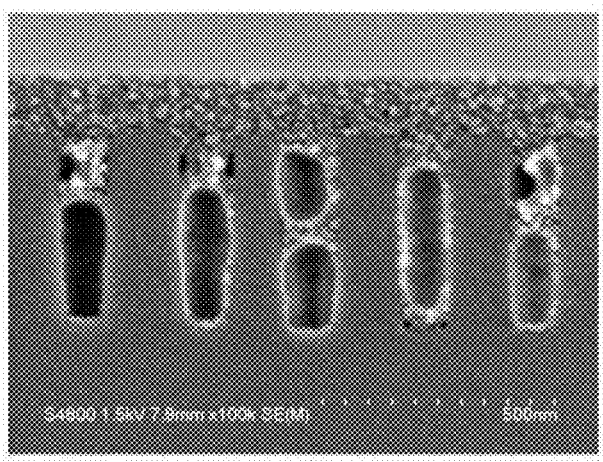
FIG. 6 is a cross-sectional SEM photograph illustrating a result of an embeddability test using a resist underlayer film-forming composition prepared in Comparative Example 1.

The resist underlayer film-forming composition prepared in each of Examples 1 to 5 and Comparative Example 1 was applied to a hole wafer using a spin coater, and baked on a hot plate at 350° C. for 1 minute to form a resist underlayer film (thickness of a portion where a hole pattern was not formed: 0.25 urn). As the hole wafer, a wafer having a pattern of hole with a diameter of 100 nm and a height of 400 nm was used. After the resist underlayer film-forming composition prepared in each of Examples 1 to 5 was applied to the hole wafer using a spin coater, and baked at 350° C. for 1 minute, the cross section of the hole wafer was observed by a scanning electron microscope (SEM). As shown in cross-sectional SEM photographs of FIGS. 1 to 5, the internal of the hole is sufficiently filled with the resist underlayer film. On the other hand, after the resist underlayer film-forming composition prepared in Comparative Example 1 was applied to the hole wafer using a spin coater, and baked at 350° C. for 1 minute, the cross section of the hole wafer was observed by a scanning electron microscope. As shown in a cross-sectional SEM photograph of FIG. 6, voids (cavities) are in the internal of the hole.

The invention claimed is:

1. A resist underlayer film-forming composition comprising a polymer having a structural unit of the following Formula (1):

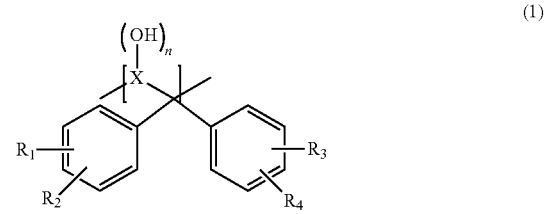

wherein X is an arylene group, n is 1 or 2, and $R_1$, $R_2$, $R_3$, and $R_4$ are each independently a hydrogen atom, a hydroxy group, a $C_{1-3}$ alkyl group, or a phenyl group, and a solvent.

2. The resist underlayer film-forming composition according to claim 1, wherein the arylene group is a phenylene group or a naphthylene group.

3. The resist underlayer film-forming composition according to claim 1, further comprising a crosslinker.

4. The resist underlayer film-forming composition according to claim 3, further comprising an acidic compound that promotes a cross-linking reaction.

5. The resist underlayer film-forming composition according to claim 1, further comprising a surfactant.

6. The resist underlayer film-forming composition according to claim 3, wherein the crosslinker comprises at least two crosslink-forming substituents.

7. The resist underlayer film-forming composition according to claim 1, wherein a ratio of the solid content of the resist underlayer film-forming composition, except for the organic solvent is, 0.5% by mass to 30% by mass.

8. The resist underlayer film-forming composition according to claim 1, wherein a weight average molecular weight of the polymer is 1,000 to 10,000 in terms of standard polystyrene.

9. The resist underlayer film-forming composition according to claim 3, wherein a content of the crosslinker is 2% by mass to 60% by mass relative to a solid content of the resist underlayer film-forming composition, except for the solvent.

10. The resist underlayer film-forming composition according to claim 4, wherein a content of the acidic compound is 0.1% by mass to 20% by mass relative to the solid content of the resist underlayer film-forming composition, except for the solvent.

11. The resist underlayer film-forming composition according to claim 5, wherein a content of the surfactant is 0.01% by mass to 5% by mass relative to the solid content of the resist underlayer film-forming composition, except for the solvent.

* * * * *